United States Patent
Imaizumi et al.

(10) Patent No.: US 6,956,100 B2
(45) Date of Patent: Oct. 18, 2005

(54) POLYAMIDE RESIN-CONTAINING VARNISH AND ITS USE

(75) Inventors: Masahiro Imaizumi, Tokyo (JP); Toyofumi Asano, Saitama (JP); Masaki Shinmoto, Saitama (JP)

(73) Assignee: Nippon Kayaku Kabushiki Kaisha, Tokyo (JP)

(*) Notice: Subject to any disclaimer, the term of this patent is extended or adjusted under 35 U.S.C. 154(b) by 18 days.

(21) Appl. No.: 10/399,122

(22) PCT Filed: Oct. 18, 2001

(86) PCT No.: PCT/JP01/09130

§ 371 (c)(1),
(2), (4) Date: Apr. 16, 2003

(87) PCT Pub. No.: WO02/34850

PCT Pub. Date: May 2, 2002

(65) Prior Publication Data

US 2004/0024124 A1 Feb. 5, 2004

(30) Foreign Application Priority Data

Oct. 20, 2000 (JP) .................................... 2000-320397

(51) Int. Cl.⁷ .................... C08G 69/00; C08G 63/00; C08L 65/40; C08L 77/00
(52) U.S. Cl. .................... 528/310; 528/86; 528/211; 528/212; 528/322; 525/88; 525/314; 525/420; 525/422; 525/432
(58) Field of Search ................... 528/310, 86, 211, 528/212, 322; 525/88, 314, 420, 422, 432

(56) References Cited

U.S. PATENT DOCUMENTS 5,686,557 A * 11/1997 Kiyohara et al. ........... 528/310

FOREIGN PATENT DOCUMENTS

| | | |
|---|---|---|
| EP | 0 388 243 | 9/1990 |
| JP | 4-170431 | 6/1992 |
| JP | 6-299133 | 10/1994 |
| JP | 8-143661 | 6/1996 |
| JP | 8-217959 | 8/1996 |
| JP | 9-31154 | 2/1997 |
| JP | 11-204521 * | 2/2001 |

* cited by examiner

Primary Examiner—P. Hampton Hightower
(74) Attorney, Agent, or Firm—Nields & Lemack

(57) ABSTRACT

An object of the present invention is to provide a polyamide resin composition from which the solvent is easily removed during film formation and which gives a film or adhesive layer reduced in residual solvent content. It is suitable for use especially as vanish. The composition and vanish are characterized by comprising as essential ingredients a phenolic hydroxyl group-having aromatic polyamide resin and a cycloalkanone as a solvent and preferably further containing a curable resin.

14 Claims, No Drawings

POLYAMIDE RESIN-CONTAINING VARNISH AND ITS USE

TECHNICAL FIELD

The present invention relates to a polyamide resin-containing varnish of good workability, which is applicable to spin coating, screen printing, adhesive films, etc.

BACKGROUND ART

Aromatic polyamide resins have excellent properties of heat resistance, film formation and toughness, and they are widely used as functional engineering plastics.

However, since their solubility in solvent is poor, aromatic polyamide resins are problematic in that their workability is not so good when they are used as films or adhesive layers. Some amide solvents may dissolve aromatic polyamide resins, but, in general, their boiling point is high and their evaporation rate is low, and therefore, the problem with them is that the solvent removal in film formation with them is difficult. As a result, the solvent used often remains in the films or adhesive layers of conventional aromatic polyamide resins, and in case where the solvent has remained therein, it has significant influences on the physical properties such as adhesiveness to substrates and heat resistance of the resin films or adhesive layers. Moreover, in case where films or adhesive layers of conventional aromatic polyamide resins dissolved in amide solvents are formed on organic substrates, there occurs still another problem in that the amide solvents of high solubility often corrode the surfaces of the organic substrates.

In view of these situations, polyamide resin-containing varnish is desired, which is free from the problems noted above and from which the solvent removal is easy during film formation to give films and adhesive layers with little solvent remaining therein.

DISCLOSURE OF THE INVENTION

We, the present inventors have assiduously studied and, as a result, have found that a resin composition that contains a phenolic hydroxyl group-having aromatic polyamide resin and a cycloalkanone is the most suitable to polyamide varnish of good workability that solves the above-mentioned problems. Specifically, the invention relates to the following:

(1) A polyamide resin-containing varnish characterized by containing a phenolic hydroxyl group-having aromatic polyamide resin (A) and, as a solvent, a cycloalkanone (B);

(2) The polyamide resin-containing varnish of above (1), wherein the phenolic hydroxyl group-having aromatic polyamide resin (A) is a polyamide resin that has, in the molecule, at least a structure of the following formula (1):

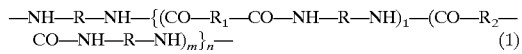

—NH—R—NH—{(CO—R$_1$—CO—NH—R—NH)$_l$—(CO—R$_2$—CO—NH—R—NH)$_m$}$_n$—    (1)

wherein R represents a divalent residue of an optionally-substituted aliphatic hydrocarbon having from 1 to 10 carbon atoms, or a divalent residue of multiple such residues bonded to each other via at least one crosslinking group selected from —CH$_2$—, —O—, —S—, —SO$_2$— and —NH—, or a divalent residue of an optionally-substituted aromatic hydrocarbon having from 6 to 10 carbon atoms, or a divalent aromatic hydrocarbon residue of multiple such aromatic hydrocarbon residues bonded to each other via at least one crosslinking group selected from an optionally-substituted linear or branched alkylene group having from 1 to 4 carbon atoms, —O—, —S—, —SO$_2$— and —NH—; R$_1$ represents a divalent hydrocarbon residue having at least one phenolic hydroxyl group and having from 6 to 12 carbon atoms; R$_3$ represents a hydrocarbon residue not having a phenolic hydroxyl group; l, m and n each represents an average degree of polymerization, and (l+m) is an integer of from 2 to 200, l/(m+l)≧0.04, and n is from 2 to 100;

(3) The polyamide resin-containing varnish of above (2), wherein R is a divalent aromatic residue of two lower alkyl-substituted phenyls bonded to each other via a methylene group, or a divalent aromatic residue of two optionally-substituted phenyl groups bonded to each other via an oxygen atom; R$_1$ is a phenylene group having at least one phenolic hydroxyl group; and R$_2$ is a phenylene group not having a phenolic hydroxyl group;

(4) The polyamide resin-containing varnish of any one of above (1) to (3), wherein the cycloalkanone (B) is cyclopentanone;

(5) The polyamide resin-containing varnish of above (2), wherein the phenolic hydroxyl group-having aromatic polyamide resin (A) is a block copolymer formed from a phenolic hydroxyl group-having aromatic polyamide resin terminated with an aminoaryl group at both ends, and a poly(butadiene-acrylonitrile) copolymer having a carboxyl group at both terminals;

(6) The polyamide resin-containing varnish of above (2), wherein the phenolic hydroxyl group-having aromatic polyamide resin (A) is a block copolymer of the following formula (2):

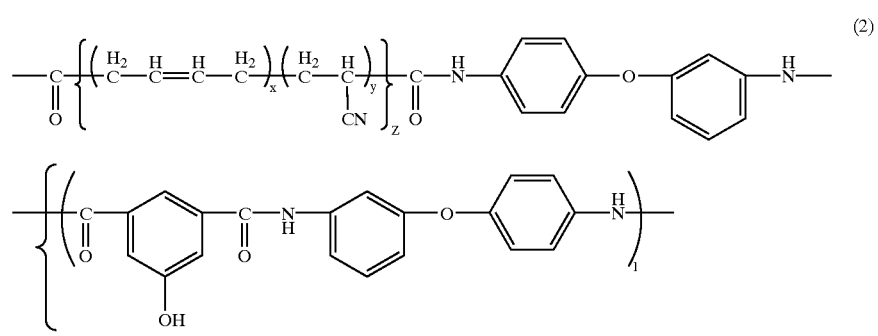

-continued

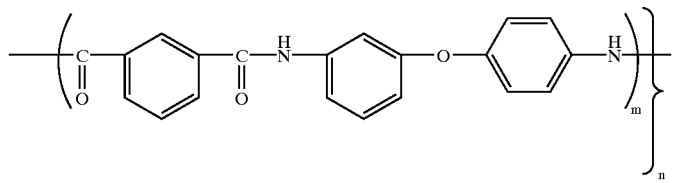

wherein x, y, z, l, m and n each represents an average degree of polymerization, and x is from 3 to 10, y is from 1 to 4, z is from 5 to 15, (l+m) is an integer of from 2 to 200, l/(m+l)≧0.04, and n is from 2 to 100;

(7) The polyamide resin-containing varnish of above (5) or (6), wherein the cycloalkanone (B) as the solvent is a cycloalkanone having from 4 to 8 carbon atoms;

(8) A substrate having an adhesive layer that is obtained by removing the solvent from the polyamide resin-containing varnish of above (7);

(9) A material for flexible printed wiring boards, for which is used the polyamide resin-containing varnish of any one of above (1) to (7);

(10) The polyamide resin-containing varnish of any one of above (1) to (7), which contains a curable resin (C);

(11) The polyamide resin-containing varnish of above (10), wherein the curable resin (C) is a thermosetting resin or a radiation-curable resin;

(12) The polyamide resin-containing varnish of above (10), wherein the curable resin (C) is an epoxy resin;

(13) A substrate having an adhesive layer that is obtained by removing the solvent from the polyamide resin-containing varnish of any one of above (10) to (12);

(14) A material for flexible printed wiring boards, which comprises the adhesive layer obtained by removing the solvent from the polyamide resin-containing varnish of any one of above (10) to (12);

(15) A cured article obtained by removing solvent from the polyamide resin varnish of any one of above (10) to (12), followed by curing it;

(16) A printed wiring board which has a cured layer of the adhesive layer that is formed by the use of the polyamide resin varnish of any one of above (10) to (12);

(17) A polyamide resin-containing composition characterized by containing a phenolic hydroxyl group-having aromatic polyamide resin (A), a cycloalkanone (B) and a curable resin (C);

(18) The polyamide resin-containing composition of above (17), of which the solid content is from 40 to 65% by mass of the composition.

BEST MODES OF CARRYING OUT THE INVENTION

The invention is described in detail hereinunder. Unless otherwise specifically indicated, "parts" and "%" in the following are all "parts by mass" and "% by mass".

The invention relates to a polyamide resin-containing composition that contains a phenolic hydroxyl group-having aromatic polyamide resin (A) and a cycloalkanone (B), and it covers all applications of any and every liquid polyamide resin. In particular, it is useful as varnish.

The polyamide resin-containing varnish of the invention is characterized by containing a phenolic hydroxyl group-having aromatic polyamide resin (A) and a cycloalkanone (B).

The phenolic hydroxyl group-having aromatic polyamide resin (A) for use in the invention may be any and every aromatic polyamide resin that has a phenolic hydroxyl group in the polymer structure, and is not specifically defined. The phenolic hydroxyl group-having aromatic polyamide resin can be obtained according to the method described in, for example, JP-A8-143661. Specifically, in the reaction of polycondensation(polyamide resin (a)) of a diamine component with a dicarboxylic acid component, at least a phenolic hydroxyl group-having compound may be used as either one of the raw components. Concretely, a dicarboxylic acid component that contains a phenolic hydroxyl group-having dicarboxylic acid and optionally a dicarboxylic acid not having a phenolic hydroxyl group (as the case may be, it may be a phenolic hydroxyl group-having dicarboxylic acid alone) is condensed with a diamine component in an ordinary manner to produce the intended resin. For example, an excess amount of a diamine is added to a dicarboxylic acid component that comprises a phenolic hydroxyl group-having dicarboxylic acid such as 5-hydroxyisophthalic acid, and a dicarboxylic acid not having a phenolic hydroxyl group such as isophthalic acid, and these are condensed in the presence of a condensing agent (e.g., phosphite) and a pyridine derivative, in an organic solvent such as N,N-dimethylacetamide or N-methyl-2-pyrrolidone in an inert atmosphere of nitrogen or the like, with stirring under heat to give a polyamide resin (a).

The phenolic hydroxyl group-having dicarboxylic acid that constitutes the dicarboxylic acid component for use in producing the polyamide resin (a) includes phenolic hydroxyl group-having aromatic dicarboxylic acids. Its preferred examples are dicarboxylic acids with an aromatic ring having from 6 to 12 carbon atoms; and more preferred are hydroxy-substituted phthalic acids, for example, 5-hydroxyisophthalic acid, 4-hydroxyisophthalic acid, 2-hydroxyphthalic acid, 3-hydroxyphthalic acid, 2-hydroxyterephthalic acid, etc. as the dicarboxylic acid not having a phenolic hydroxyl group, usable are any of aromatic dicarboxylic acids or aliphatic dicarboxylic acids. The aromatic dicarboxylic acids are preferably those with an aromatic ring (this may be any of condensed rings or bonded rings) having from 6 to 12 carbon atoms, such as phthalic acid, isophthalic acid, terephthalic acid, dicarboxynaphthalene, 4,4'-diphenyldicarboxylic acid, 3,3'-methylene-dibenzoicacid, etc. More preferred is phthalic acid. The aliphatic dicarboxylic acids may be those of which the aliphatic group has from 1 to 6 carbon atoms, such as succinic acid, fumaric acid, glutaric acid, adipic acid, 1,3-cyclohexanedicarboxylic acid.

The diamine component includes aliphatic hydrocarbon diamines optionally having a substituent except amino group and having from 1 to 10 carbon atoms; aliphatic hydrocarbon diamines of multiple aliphatic hydrocarbons optionally having a substituent except amino group and having from 1 to 10 carbon atoms, which are bonded to each other via at least one crosslinking group selected from —CH$_2$—, —O—, —S—, —SO$_2$— and —NH—; optionally-substituted aromatic hydrocarbon diamines having from 6 to 10 carbon atoms; and aromatic hydrocarbon diamines of multiple, for example, 2 or 3 such aromatic hydrocarbons bonded to each other via at least one crosslinking group selected from an optionally-substituted linear or branched alkylene group having from 1 to 4 carbon atoms, —O—, —S—, —SO$_2$— and —NH—. Aromatic hydrocarbon diamines having a phenolic hydroxyl group may serve also as phenolic hydroxyl group-having diamines. Preferred for use herein are aromatic diamines that are formed of two amino-substituted phenyls optionally having a substituent except the amino group and bonded to each other via a methylene group or an oxygen atom. The substituent except amino group that may be on the phenyl group of the aromatic diamines includes a hydroxyl group, a lower alkyl group having from 1 to 4 carbon atoms, a nitro group, a halogen atom, etc. It is preferably a lower alkyl group. Preferably, the aromatic diamines are bis(amino-mono or di-lower alkyl-substituted phenyl)methanes, more preferably bis(4-amino-3,5-di-lower alkyl-substituted phenyl)methanes, etc.

Concretely, the phenolic hydroxyl group-having diamines include, for example, 3,3'-diamine-4,4'-dihydroxyphenyl-methane, 2,2-bis(3-amino-4-hydroxyphenyl) hexafluoropropane, 2,2-bis(3-amino-4-hydroxyphenyl) difluoromethane, 3,4-diamino-1,5-benzenediol, 3,3'-dihydroxy-4,4'-diamino-bisphenyl, 3,3'-diamino-4,4'-dihydroxybiphenyl, 2,2-bis(3-amino-4-hydroxyphenyl) ketone, 2,2-bis(3-amino-4-hydroxy-phenyl) sulfide, 2,2-bis (3-amino-4-hydroxyphenyl) ether, 2,2-bis(3-amino-4-hydroxyphenyl) sulfone, 2,2-bis(3-amino-4-hydroxyphenyl) propane, 2,2-bis(3-hydroxy-4-amino-phenyl) propane, 2,2-bis(3-hydroxy-4-aminophenyl)methane, etc. The diamines not containing a phenolic hydroxyl group include, for example, 3,3'-diaminodiphenyl ether, 3,4'-diaminodiphenyl ether, 4,4'-diaminodiphenyl ether, bis(4-amino-3,5-diethyl-phenyl)methane, diaminonaphthalene, piperazine, hexamethylenediamine, tetramethylenediamine, m-xylenediamine, 4,4'-diaminodiphenylmethane, 4,4'-diaminobenzophenone, 2,2'-bis(4-aminophenyl)propane, 3,3'-diaminodiphenyl sulfone, 3,3'-diaminodiphenyl, etc. However, the invention is not limited to those.

Any of amino group or carboxyl group may be at both terminals of the thus-obtained polyamide resin (a), and it may be readily controlled by the molar ratio of the diamine component and the dicarboxylic acid component. Specifically, the resin having an amino group at both terminals thereof may be obtained by using an excess amount of the diamine component, for example, 1.1 mol % or more, preferably 1.15 mol % or more, more preferably 1.2 mol % or more relative to one mol of the dicarboxylic acid component. Contrary to this, for the resin having a carboxyl group at both terminals thereof, an excess amount of the dicarboxylic acid component shall be used.

Further, for making the cured articles have increased flexibility, softness and adhesiveness, it is desirable that a block copolymer (polyamide resin (b)) obtained through polycondensation of the polyamide resin (a) with a poly (butadiene-acrylonitrile) copolymer as the phenolic hydroxyl group-having aromatic polyamide resin (A).

The polycondensation may be effected, for example, according to the method described in U.S. Pat. No. 5,342, 895, JP-A6-299133, etc. Concretely, a poly (butadiene-acrylonitrile) copolymer is added to a solution of the polyamide resin (a) and the two are polycondensed. In this case, the ratio of the poly(butadiene-acrylonitrile) copolymer to the polyamide resin (a) is not specifically defined, but in general, the amount of the poly(butadiene-acrylonitrile) copolymer may fall between 0.1 and 10 parts or so, but preferably between 0.3 and 5 parts, more preferably between 0.5 and 2 parts or so relative to 1 part of the polyamide resin (a).

For producing the polyamide resin (b) through reaction of the polyamide resin (a) with a poly(butadiene-acrylonitrile) copolymer, employable is any method of reacting the polyamide resin (a) having an amino group at both terminals thereof with a poly(butadiene-acrylonitrile) copolymer having a carboxyl group at both terminals thereof, or reacting the polyamide resin (a) having a carboxyl group at both terminals thereof with a poly(butadiene-acrylonitrile) copolymer having an amino group at both terminals thereof, but the former method is preferred. In this case, the amino group in the polyamide resin (a) is preferably an aminoaryl group. If desired, the terminals of the polyamide resin (a) or the poly(butadiene-acrylonitrile) copolymer may be modified before the two are reacted. In this case, for example, one may be modified with a vinyl group and the other with an —NH or —SH group.

Poly(butadiene-acrylonitrile) copolymers having various functional groups at both terminals thereof are commercially available from Goodrich as Hycar CTBN (trade name), and any of these may be used for block polycondensation with the polyamide resin (a).

Preferably in the invention, the polyamide resins (a) and (b) have at least a structure of the following formula (1):

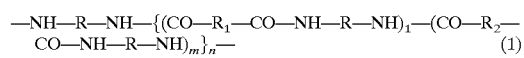

—NH—R—NH—{(CO—R$_1$—CO—NH—R—NH)$_l$—(CO—R$_2$—CO—NH—R—NH)$_m$}$_n$—     (1)

wherein R represents a divalent residue of an optionally-substituted aliphatic hydrocarbon having from 1 to 10 carbon atoms, or a divalent residue of multiple, preferably two or three such residues bonded to each other via at least one crosslinking group selected from —CH$_2$—, —O—, —S—, —SO$_2$— and —NH—, or a divalent residue of an optionally-substituted aromatic hydrocarbon having from 6 to 10 carbon atoms, or a divalent aromatic hydrocarbon residue of multiple, preferably two or three such aromatic hydrocarbon residues bonded to each other via at least one crosslinking group selected from an optionally-substituted linear or branched alkylene group having from 1 to 4 carbon atoms, —O—, —S—, —SO$_2$— and —NH—; R$_1$ represents a divalent hydrocarbon residue having at least one phenolic hydroxyl group and having from 6 to 12 carbon atoms, preferably a phenylene group having at least one phenolic hydroxyl group; R$_2$ represents a hydrocarbon residue not having a phenolic hydroxyl group, preferably a phenylene group not having a phenolic hydroxyl group; l, m and n each represents an average degree of polymerization, and (l+m) is an integer of from 2 to 200, l/(m+l)≧0.04, and n is from 2 to 100, preferably from 2 to 30.

The ratio of m to l is not specifically defined provided that it satisfies l/(m+l)≧0.04, but in general, it is preferably at most 0.5. In formula (1), R is preferably a bis(substituted phenyl)methane-derived residue or an optionally-substituted biphenyl ether residue, for example, a divalent aromatic residue of two lower alkyl-substituted phenyls bonded to each other via a methylene group, or a divalent aromatic residue of two optionally-substituted phenyl groups bonded to each other via an oxygen atom; R$_1$ is preferably a phenolic hydroxyl group-substituted phenylenedicarboxylic acid-derived residue, for example, a phenylene group having at least one phenolic hydroxyl group; and R$_2$ is preferably a phenylenedicarboxylic acid-derived residue, for example, a phenylene group not having a phenolic hydroxyl group.

The polyamide resin (b) is especially preferably a copolymer of the following formula (2);

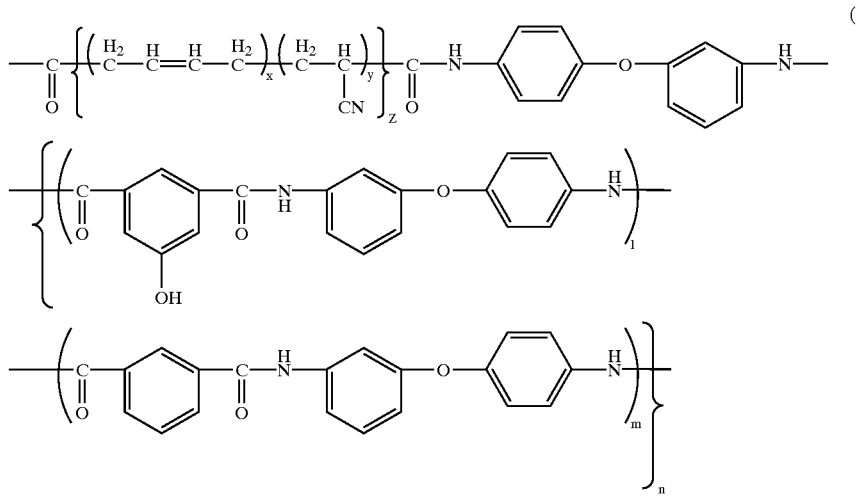

(2)

wherein x, y, z, l, m and n each represents an average degree of polymerization, and x is from 3 to 10, y is from 1 to 4, z is from 5 to 15, (l+m) is an integer of from 2 to 200, l/(m+l)≧0.04, and n is from 2 to 100.

The cycloalkanone (B) for use in the invention includes compounds with cycloalkanone skeleton having from 4 to 8 carbon atoms such as cyclobutanone, cyclopentanone, cyclohexanone, cycloheptanone and cyclooctanone, but is not limited to them. Of those, cyclopentanone is the most preferable. Not detracting from the solubility therein of the polyamide resin (A), it may be mixed with any other solvent for use herein. Though not specifically defined, the solvent that may be mixed with it is preferably any of ketone solvents, ether solvents, aromatic solvents, etc.

The blend ratio (by mass) of the polyamide resin (A) to the cycloalkanone (B) significantly depends on the use of the varnish to be obtained herein, and therefore could not be indiscriminately determined. In general, however, (A)/(B) may fall between 0.01 and 2, preferably between 0.1 and 1.

The polyamide resin-containing composition of the invention can be obtained by uniformly mixing the polyamide resin (A) and the cycloalkanone (B) in a predetermined ratio, and it can be used as varnish. Preferably, a curable resin (C) is further added to it. The curable resin added to it makes the cured film and adhesive layer of the composition have good heat resistance, moisture resistance and solvent resistance. The curable resin may be any and every one having the ability to cure, and any of thermosetting resin and radiation-curable resin is usable herein. Preferably, however, it is reactive with a phenolic hydroxyl group.

Specific examples of the curable resin (C) are epoxy resins, isocyanate resins, cyanate resins, maleimide resins, acrylate resins, methacrylate resins, unsaturated polyester resins, oxetane resins, vinyl ether resins, etc. Preferred are thermosetting epoxy resins or radiation-curable resins. As the radiation-curable resins, preferred are epoxy(meth)acrylate resins. These are for exemplification, to which, therefore, the invention should not be limited. The term as "(meth)acrylate" referred to herein means acrylate and/or methacrylate.

The blend ratio of the curable resin (C) significantly depends on the use of the resin mixture, and therefore could not be indiscriminately determined. In general, however, the additional resin may accounts for approximately from 5 to 95%, preferably from 20 to 80% of all the composition except the solvent component. In terms of its ratio to the polyamide resin (A) for use in the invention, the amount of the additional resin may be from 0.5 to 10 parts, preferably from 1 to 5 parts, more preferably from 1.2 to 4 parts or so relative to one part of the resin (A).

The epoxy resin for use in the invention may be any of thermosetting resin or radiation-curable resin. For example, it includes (i) glycidyl ether-type polyfunctional epoxy resins, (ii) glycidyl ester-type epoxy resins, (iii) glycidylamine-type epoxy resins, (iv) alicyclic epoxy resins, (v) heterocyclic epoxy resins, (vi) epoxy (meth)acrylate resins, etc. However, these are not limitative. In the invention, the polyfunctional epoxy resin means an epoxy resin having at least two glycidyl groups.

The glycidyl ether-type polyfunctional epoxy resins (i) include, for example, (ia) polyfunctional epoxy resins of glycidyl-etherified polyphenol compounds, (ib) polyfunctional epoxy resins of glycidyl-etherified various novolak resins, and (ic) aliphatic epoxy resins of glycidyl-etherified polyalcohols.

The polyphenol compounds that are the material compounds for the polyfunctional epoxy resins (ia) include substituted or unsubstituted bisphenols, for example, bisphenols that are unsubstituted or substituted with a lower (C1–C4) alkyl group on the benzene ring and/or with a halogen such as fluorine on the alkyl chain, such as bisphenol A, bisphenol F, bisphenol S, tetramethylbisphenol A, dimethylbisphenol A, tetramethyl-bisphenol F, dimethyl-bisphenol F, tetramethylbisphenol S and dimethylbisphenol S; as well as 4,4'-biphenylphenol, tetramethyl-4,4'-biphenol, dimethyl-4,4'-biphenylphenol, 1-(4-hydroxyphenyl)-2-[4-(1,1-bis-(4-hydroxyphenyl)ethyl)-phenyl]propane, 2,2'-methylene-bis(4-methyl-6-tert-butylphenol) and 4,4'-butylidene-bis(3-methyl-6-tert-butylphenol), trishydroxyphenylmethane, resorcinol, hydroquinone, pyrogallol, diisopropylidene skeleton-having phenols, fluorene skeleton-having phenols such as 1,1-di-4-hydroxyphenylfluorene, and polyphenol compounds such as phenolated polybutadiene. These polyphenol compounds are glycidyl-etherified to give the glycidyl ether-type polyfunctional epoxy resins for use in the invention.

The polyfunctional epoxy resins (ib) are glycidyl-etherified various novolak resins, including, for example, novolak resins obtained from various phenols of raw materials such as substituted or unsubstituted mono or polyphenols or substituted or unsubstituted mono or polynaphthols, xylylene skeleton-having phenol-novolak resins, dicyclopentadiene skeleton-having phenol-novolak resins, biphenyl skeleton-having phenol-novolak resins, fluorene skeleton-having phenol-novolak resins, phenanthrene skeleton-having phenol-novolak resins and furan skeleton-having phenol-novolak resins. The substituted or unsubstituted mono or polyphenols and the substituted or unsubstituted mono or polynaphthols that are used as the raw materials for the above-mentioned novolak resins are, for example, mono or polyphenols and mono or polynaphthols each having from 1 to 3 hydroxyl groups, and these may optionally have any other substituent than the hydroxyl group. The substituent except hydroxyl group includes, for example, an unsubstituted alkyl group having from 1 to 10 carbon toms, a substituted alkyl group having from 1 to 10 carbon atoms, a halogen atom, etc. The substituted alkyl group having from 1 to 10 carbon atoms is, for example, an alkyl group having from 1 to 10 carbon atoms and substituted with any of a halogen atom, a phenyl group, a hydroxy-substituted phenyl group, etc. The alkyl group having from 1 to 10 carbon atoms includes a methyl group, an ethyl group, a propyl group, a butyl group, a pentyl group, a hexyl group, a heptyl group, an octyl group, a nonyl group, a decanyl group, etc.

Typical examples of the mono or polyphenols and mono or polynaphthols are cresols, ethylphenols, butylphenols, octylphenols, bisphenol A, bisphenol F, bisphenol S and naphthols.

The aliphatic epoxy resins (ic) are, for example, glycidyl-etherified compound of polyalcohols that are mentioned below. The polyalcohols that are used for the raw materials for the aliphatic epoxy resins are, for example, 1,4-butanediol, 1,6-hexanediol, polyethylene glycol, pentaerythritol, etc.

The glycidyl ester-type epoxy resins (ii) include epoxy resins of glycidyl esters of carboxylic acids, preferably those of dicarboxylic acids. For example, they are epoxy resins of diglycidyl esters of dicarboxylic acids such as hexahydrophthalic acid or phthalic acid, etc.

The glycidylamine-type epoxy resins (iii) are, for example, epoxy resins obtained by glycidylation of amines, preferably aromatic amines. For example, they are epoxy resins obtained by glycidylation of phenylamines such as aniline, toluidine, etc.

The alicyclic epoxy resins (iv) are, for example, epoxy resins having a cyclo ring of from 4 to 8 carbon atoms, preferably 5or 6carbon atoms. For example, they are alicyclic epoxy resins having an aliphatic skeleton such as cyclohexane, etc.

The heterocyclic epoxy resins (v) are, for example, 5 or 6-membered heterocyclic epoxy resins, etc. Concretely, they are heterocyclic epoxy resins having a hetero ring such as isocyanuric ring, hydantoin ring, etc.

The epoxy (meth)acrylate resins (vi) include reaction products of any of the above-mentioned epoxy resins (i) to (v) with a compound having one unsaturated double bond and one carboxyl group in one molecule. The compound having one unsaturated double bond and one carboxyl group in one molecule is, for example, (meth)acrylic acid or a reaction product of a hydroxyl group-having (meth)acrylate (e.g., 2-hydroxyethyl (meth)acrylate, 2-hydroxypropyl (meth)acrylate, 1,4-butanediol mono(meth)acrylate) with an acid anhydride of a polycarboxylic acid compound (e.g., succinic anhydride, maleic anhydride, phthalic anhydride, tetrahydrophthalic anhydride, hexahydrophthalic anhydride), etc.

Suitable one of these epoxy resins is selected for use in accordance with the desired characteristics. In general, glycidyl ether-type epoxy resins are preferable. Preferred examples of the glycidyl ether-type epoxy resins are bisphenol-type epoxy resins, phenol skeleton-having novolak-type epoxy resins, triphenylmethane skeleton-having novolak-type epoxy resins, and dicyclopentadiene skeleton-having novolak-type epoxy resins, and bisphenol-type epoxy resins are more preferred. The bisphenol-type epoxy resins include, for example, bisphenol A-type epoxy resins, bisphenol F-type epoxy resins, etc. The phenol skeleton-having novolak-type epoxy resins include, for example, phenol-novolak-type epoxy resins, cresol-novolak-type epoxy resins, phenol skeleton and naphthol skeleton-having novolak-type epoxy resins, and phenol skeleton and biphenyl skeleton-having novolak-type epoxy resins, phosphorous atom-containing novolak resins having phosphaphenanthrene skeleton or the like, etc.

In case where the composition or the varnish of the invention contains such an epoxy resin, it may optionally contain a compound such as amines, phenols, hydrazides, imidazoles and the like as a curing agent.

The amines used as the curing agent are, for example, aromatic amines such as diaminodiphenylmethane, diaminodiphenyl sulfone, diaminodiphenyl ether, p-phenylenediamine, m-phenylenediamine, o-phenylenediamine, 1,5-diaminonaphthalene, m-xylylenediamine; aliphatic amines such as ethylenediamine, diethylenediamine, isophoronediamine, bis(4-amino-3-methyldicyclohexyl)methane, polyetherdiamine; and guanidines such as dicyanamide, 1-(o-tolyl)biguanide.

The phenols include, for example, bisphenol A, bisphenol F, bisphenol S, 4,4'-biphenylphenol, tetramethylbisphenol A, dimethylbisphenol A, tetramethylbisphenol F, dimethylbisphenol F, tetramethylbisphenol S, dimethylbisphenol S, tetramethyl-4,4'-biphenol, dimethyl-4,4'-biphenylphenol, 1-(4-hydroxy-phenyl)-2-[4-(1,1-bis-(4-hydroxyphenyl) ethyl)-phenyl]propane, 2,2'-methylene-bis(4-methyl-6-tert-butylphenol), 4,4'-butylidene-bis(3-methyl-6-tert-butylphenol), trishydroxyphenylmethane, resorcinol, hydroquinone, pyrogallol, diisopropylidene skeleton-having phenols, fluorene skeleton-having phenols such as 1,1-di-4-hydroxyphenyl-fluorene, phenolated polybutadiene; as well as novolak resins obtained from raw materials of various phenols such as phenol, cresols, ethylphenols, butylphenols, octylphenols, bisphenol A, bisphenol F, bisphenol S, naphthols; other various novolak resins such as xylylene skeleton-having phenol-novolak resins, dicyclopentadiene skeleton-having phenol-novolak resins, biphenyl skeleton-having phenol-novolak resins, fluorene skeleton-having phenol-novolak resins; and halogenophenols such as bromobisphenol A, bromobisphenol F, bromobisphenol S, bromophenol-novolaks, bromocresol-novolaks, chlorobisphenol S, chlorobisphenol A.

The hydrazides include, for example, adipic dihydrazide, sebacic dihydrazide, isophthalic dihydrazide, maleic dihydrazide.

The imidazoles are, for example, various imidazoles such as 2-methylimidazole, 2-phenylimidazole, 2-undecylimidazole, 2-heptadecylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyano-ethyl-2-undecylimidazole, 2,4-diamino-6(2'-methylimidazole (1')) ethyl-s-triazine, 2,4-diamino-6(2'-undecylimidazole (1')) ethyl-s-triazine, 2,4-diamino-6(2'-ethyl, 4-methyl-imidazole (1'))ethyl-s-triazine, isocyanuric acid adduct of 2,4-diamino-6(2'-methyl-imidazole(1'))ethyl-s-triazine, isocyanuric acid adduct of 2-methylimidazole(2-methylimidazole:isocyanuric acid=2:3), isocyanuric acid adduct of 2-phenylimidazole, 2-phenyl-3,5-dihydroxy-methylimidazole, 2-phenyl-4-hydroxymethyl-5-methyl-imidazole, 1-cyanoethyl-2-phenyl-3,5-dicyanoethoxymethyl-imidazole; and salts of such imidazoles with polycarboxylic acids such as phthalic acid, isophthalic acid, terephthalic acid, trimellitic acid, pyromellitic acid, naphthalenedicarboxylic acid, maleic acid, oxalic acid.

Any of these curing agents is suitably selected for use herein in accordance with the desired characteristics. Preferred are phenols and guanidines such as dicyandiamide, 1-(o-tolyl)biguanide, etc. The curing agent is optionally used in amount of generally from 0.3 to 2.0, preferably from 0.4 to 1.6, more preferably from 0.5 to 1.3 in terms of the equivalent ratio thereof to the epoxy group of the epoxy resin. Two or more of the above-mentioned curing agents may be used together, and the imidazoles may be used also as a curing promoter.

In case where these curing agents are used, a curing promoter may be added thereto, if desired. The curing promoter is not specifically defined. For example, it includes imidazoles such as 2-methylimidazole, 2-ethyl-4-methylimidazole, 2-phenylimidazole, 2-undecylimidazole, 2-hepta-decylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyano-ethyl-2-undecylimidazole, 2,4-diamino-6(2'-methylimidazole (1'))ethyl-s-triazine, 2,4-diamino-6(2'-undecylimidazole (1'))ethyl-s-triazine, 2,4-diamino-6(2'-ethyl, 4-methyl-imidazole(1'))ethyl-s-triazine, isocyanuric acid adduct of 2,4-diamino-6(2'-methylimidazole(1'))ethyl-s-triazine, isocyanuric acid adduct of 2-methylimidazole (2-methyl-imidazole:isocyanuric acid=2:3), isocyanuric acid adduct of 2-phenylimidazole, 2-phenyl-3,5-dihydroxymethylimidazole, 2-phenyl-4-methyl-5-hydroxymethylimidazole or, 1-cyanoethyl-2-phenyl-3,5-dicyanoethoxymethylimidazole; and salts of such imidazoles with polycarboxylic acids such as phthalic acid, isophthalic acid, terephthalic acid, trimellitic acid, pyromellitic acid, naphthalenedicarboxylic acid, maleic acid oroxalic acid; phosphorus compounds such as triphenylphosphine; tertiary amine compounds such as triethylamine, tetraethanolamine, 1,8-diazabicyclo[5.4.0]-7-undecene (DBU), N,N-dimethylbenzylamine, 1,1,3,3-tetramethylguanidine or N-methylpiperazine; and boron compounds such as 1,8-diazabicyclo[5.4.0]-7-undeceniumtetraphenylborate. The curing promoter is optionally used in amount of generally from 0.01 to 5 parts, preferably from 0.1 to 3 parts relative to 100 parts of the epoxy resin.

The radiation-curable resin that is optionally used in the invention is a resin that is curable through exposure to radiations such as IRrays, visible rays, UV rays, electron rays or X-rays. The radiation-curable resin includes, for example, (meth)acrylate compounds, epoxy compounds, vinyl ether compounds, oxetane compounds, azide compounds, diazo compounds, nitro compounds, etc. (Meth)acrylate compounds are especially preferred. The (meth)acrylate compounds are, for example, (meth)acrylates such as 2-hydroxyethyl (meth)acrylate, phenoxyethyl (meth)acrylate, acryloylmorpholine, isobornyl (meth)acrylate, 1,6-hexanediol di(meth)acrylate, nonanediol di(meth)acrylate, polyethylene glycol di(meth)acrylate, trimethylolpropane tri(meth)acrylate, pentaerythritol tri(meth) acrylate, pentaerythritol tetraacrylate, ditrimethylolpropane tetra(meth)acrylate, dipentaerythritol poly(meth)acrylate, epoxy(meth)acrylate. One or more of those may be used herein either singly or together. In this case, a photopolymerization initiator or the like that is generally used in the art may be used together.

The polyamide resin-containing varnish of the invention may optionally contain a filler. The filler includes fused silica, crystalline silica, silicon carbide, silicon nitride, boron nitride, calcium carbonate, magnesium carbonate, barium sulfate, calcium sulfate, mica, talc, clay, alumina, magnesium oxide, zirconium oxide, aluminium hydroxide, magnesium hydroxide, calcium silicate, aluminium silicate, aluminium lithium silicate, zirconium silicate, barium titanate, glass fibers, carbon fibers, molybdenum disulfide, asbestos, etc. Preferred are fused silica, crystalline silica, silicon nitride, boron nitride, calcium carbonate, barium sulfate, calcium sulfate, mica, talc, clay, alumina, and aluminium hydroxide. Regarding the particle size of the filler, it is desirable that particles having a mean particle size of at most 20 μm account for at least 80%, more preferably at least 85%, even more preferably at least 90%. If the small particles account for less than 80%, problems may be caused in the film smoothness. These fillers may be used either singly or two more together.

The polyamide resin-containing varnish of the invention may optionally contain any of flame retardant, colorant, coupling agent, leveling agent and the like in accordance with its object. The flame retardant includes halogenoepoxy resins; inorganic flame retardants such as antimony trioxide, antimony pentoxide, tin oxide, tin hydroxide, molybdenum oxide, zinc borate, barium metaborate, red phosphorus, aluminium hydroxide, magnesium hydroxide, calcium aluminate; and phosphorus-containing flame retardants such as tris(tribromophenyl) phosphate. Not specifically defined, the colorant includes various organic dyes such as phthalocyanine dyes, azo dyes, disazo dyes, quinacridone dyes, anthraquinone dyes, flavanthrone dyes, perinone dyes, perylene dyes, dioxazine dyes, condensed azo dyes, azomethine dyes; and inorganic pigments such as titaniumoxide, lead sulfate, chrome yellow, zinc yellow, chrome vermilion, red iron oxide, cobalt violet, prussian blue, ultramarine blue, carbon black, chrome green, chromium oxide, cobalt green.

The coupling agent includes silane coupling agents such as 3-glycidoxypropyltrimethoxysilane, 3-glycidoxypropyl-methyldimethoxysilane, 3-glycidoxypropylmethyldimethoxy-silane, 2-(3,4-epoxycyclohexyl)ethyltrimethoxysilane, N-(2-aminoethyl)-3-aminopropylmethyldimethoxysilane, N-(2-amino-ethyl)-3-aminopropylmethyltrimethoxysilane, 3-aminopropyl-triethoxysilane, 3-mercaptopropyltrimethoxysilane, vinyltrimethoxysilane, N-(2-(vinylbenzylamino)ethyl)-3-aminopropyltrimethoxysilane hydrochloride, 3-methacryloxypropyl-trimethoxysilane, 3-chloropropylmethyldimethoxysilane, 3-chloropropyltrimethoxysilane; titanium coupling agents such as isopropyl (N-ethylaminoethylamino)titanate, isopropyl triisostearoyltitanate, titanium di(dioctyl-pyrophosphate)oxyacetate, tetraisopropyl di(dioctyl-phosphite)titanate, neoalkoxytri(p-N-(β-aminoethyl)amino-phenyl) titanate; zirconium or aluminium coupling agents such as Zr-acetylacetonate, Zr-methacrylate, Zr-propionate, neoalkoxy zirconate, neoalkoxytrisneodecanoyl zirconate, neoalkoxytris(dodecanoyl)benzenesulfonyl zirconate, neoalkoxytris(ethylenediaminoethyl) zirconate, neoalkoxytris(m-aminophenyl) zirconate, ammonium zirconium carbonate, Al-acetylacetonate, Al-methacrylate, Al-propionate. Preferred are silicon-based coupling agents.

The coupling agent improves the moisture-resistant reliability of the cured articles, and prevents the adhesiveness of the cured articles from lowering when they have absorbed moisture.

The leveling agent includes oligomers having a molecular weight of from 4000 to 12000 of acrylates such as ethyl acrylate, butyl acrylate, 2-ethylhexyl acrylate; epoxidated soybean fatty acids, epoxidated abietyl alcohol, hydrogenated castor oil, titanium coupling agents, modified silicones, anionic or nonionic surfactants, etc. The polyamide resin-containing composition or varnish of the invention can be obtained by uniformly mixing the polyamide resin (A), the cycloalkane (B) and optionally the curable resin (C), curing agent, flame retardant, colorant, coupling agent, etc. Thus obtained, the solid content of the composition or the varnish may fall generally between 10 and 80%, preferably between 30 and 70%, more preferably between 40 and 65% by mass. The solid matter in the composition or the varnish may be the polyamide resin (A) alone, preferably contain the curable resin (C). If desired, it may optionally contain any other components mentioned above.

For obtaining a substrate that has the adhesive layer of the invention, the varnish is coated onto a substrate, for example, a sheet substrate such as release film or metal foil or a plate substrate such as plastic plate, by the use of a roll coater, a comma coater, a die coater, a spin coater or the like, and then it is dried in a hot oven. The drying condition significantly depends on the solvent used and the thickness of the layer to be formed. In general, however, the drying temperature may fall between 80° C. and 180° C., and the drying time may fall between 30 seconds and 30 minutes.

Not specifically defined, the shape of the adhesive layer-having substrate thus obtained may be film (or sheet) or may be plate. If desired, a protective sheet such as release paper may be provided on the adhesive layer. Thus obtained, the substrate serves as an adhesive film (sheet) or the like, and is favorable for substrates or adhesives to constitute insulating sheets for build-up boards, materials for insulator-coated metal foil for build-up boards, as well as boards for flexible printed wiring, cover lay materials and bonding sheets (these will be generically referred to as flexible printed wiring board materials).

For example, in case where the coated substrate is used for the materials to constitute build-up boards or flexible printed wiring boards, the varnish of the invention is applied onto a substrate that corresponds to the intended object in accordance with the coating method such as that mentioned above, and then, if desired, the solvent is removed to give the substrate having an adhesive layer. The substrate is fitted into the intended boards as a constitutive part of the boards in any desired manner of, for example, bonding or the like, and then the layer is cured. As the case may be, the varnish of the invention may be directly applied to the necessary parts of boards, not using the substrate as in the above, for example, directly onto an insulating board that has a first circuit formed thereon, and then, if desired, the solvent is removed to form the adhesive layer, and, if further desired, any other layers are laminated thereon and then the adhesive varnish layer is cured to form the boards. The method of curing the adhesive layer is not specifically defined and may be suitably determined in accordance with the resin used. In general, the adhesive layer may be cured in any ordinary method of exposing it to heat or radiations. An insulating sheet for build-up boards and an insulator-coated metal foil for build-up boards, wherein the varnish of the invention is used, are described below.

A method for fabricating an insulating sheet for build-up boards is described. In case where a insulating sheet having a release film layer on one surface is fabricated, a varnish that has been previously prepared (the varnish of the invention, the same shall apply hereinunder) is coated onto a release film with a roll coater, a comma coater or the like. This is led into an in-line drier, in which it is heated generally at 40 to 160° C. for 2 to 20 minutes to remove the solvent from the varnish, and an adhesive layer is thereby formed. On the other hand, for fabricating an insulating sheet that has release films layer on both faces thereof, a release film is pressed and attached to the adhesive-coated faces of the adhesive-coated insulating sheet that has been fabricated according to the above-mentioned method, by the hot roll. The coating thickness of the adhesive layer may fall generally between 40 and 80 μm in a dry state.

The release film usable herein includes polyethylene film, polypropylene film, TPX (methylpentene copolymer) film, PE (polyethylene) film, silicone lubricant-coated polyethylene film, polypropylene film and PE film, polyethylene resin-coated paper, polypropylene resin-coated paper, TPX resin-coated paper, etc. The thickness of the release film preferably falls between 13 and 75 μm for film-base ones, and between 50 and 200 μm for paper-base ones. However, it is not specifically defined and may be suitably determined in accordance with the object of the release film.

A method of using the varnish of the invention for fabricating insulator-coated metal foil for build-up boards is described. The varnish that has been previously prepared is coated onto metal foil with a roll coater, a comma coater or the like. This is led into an in-line drier, in which it is heated generally at 40 to 160° C. for 2 to 20 minutes to remove the solvent from the varnish, and an adhesive layer is thereby formed. The coating thickness of the adhesive layer may fall generally between 40 and 80 μm in a dry state.

Examples of the metal foil usable herein are electrolytic copper foil, rolled copper foil, aluminium foil, tungsten foil, iron foil, etc. Generally used are electrolytic copper foil and rolled copper foil because of their good workability, bendability and electroconductivity. The thickness of the metal foil generally falls between 3 and 70 μm, but is not specifically defined. It may be suitably determined in accordance with the condition to be used, etc.

Thus obtained, the insulating sheet for build-up boards and the insulator-coated metal foil for build up boards may be used in fabricating multi-layered printed wiring boards.

The multi-layered printed wiring boards may be fabricated, for example, as follows:

Concretely, an insulating board is patterned to form a first circuit thereon. Then, the above-mentioned, insulating sheet for build-up boards and/or the insulator-coated metal foil for build up boards is airtightly stuck to the first circuit and at a time heated and pressed by means of a laminator, a press or the like to thereby form an insulating layer. In case where a thermosetting resin is used as the curable resin (C), the adhesive layer is cured by the said heat and press treatment, and the insulating layer is thereby fixed onto the first circuit. For enhancing the adhesiveness between the first circuit and the insulating layer, the copper that constitutes the first circuit may be processed for redox treatment; and for enhancing the adhesive infiltration thereinto, the first circuit may be processed for primer treatment with a dilute resin solution prior to the heat and press treatment thereof. Next, contact holes are formed through laser working in the insulating layer to reach the first circuit, and, if desired, through-holes are optionally formed therein through drilling or laser working, and thereafter a second circuit is formed on the insulating layer. In case where the insulating layer is formed of the insulating sheet for build-up boards, it is pre-treated for enhancing its adhesiveness to non-electrolytic plate copper. For this, the layer is processed with an acidic oxidizing etchant such as chromium-sulfuric acid or with an alkaline oxidizing etchant such as metal permanganate for thereby selectively chemically roughening the area in which the second circuit is to be formed and also the contact holes. Then, this is neutralized, washed with water, and processed to receive a catalyst imparted thereto. After the process, this is dipped in a non-electrolytic copper plating bath, in which copper is deposited in the through-holes, the non-through contact holes and the insulating layer so that the thus-deposited copper layer may have a necessary thickness. In this process, if desired, the plating may be effected electrolytically to increase the copper plate layer. Next, this is etched to form a wiring pattern that is to be the second circuit, and this gives the multi-layered printed wiring board. Alternatively, the area except the second circuit-forming part may be masked with a plating resist, and the circuit-forming part and the contact holes are selectively chemically roughened for enhancing the adhesiveness to non-electrolytic plate copper. Then, this is neutralized, washed with water, and processed to receive a catalyst imparted thereto. After the process, this is dipped in a non-electrolytic copper plating bath, in which copper is deposited in the through-holes, the non-through contact holes and the insulating layer so that the thus-deposited copper layer may have a necessary thickness to form a wiring pattern, and this also gives the multi-layered printed wiring board.

In case where the insulating layer is formed of the insulator-coated metal foil for build-up boards, its contact holes are selectively chemically roughened with the above-mentioned etchant for enhancing the adhesiveness between the insulating layer and the non-electrolytic plate copper formed thereon. Then, this is neutralized, washed with water, and processed to receive a catalyst imparted thereto. After the process, this is dipped in a non-electrolytic copper plating bath, in which copper is deposited in the through-holes and the non-through contact holes so that the thus-deposited copper layer may have a necessary thickness. In this process, if desired, the plating may be effected electrolytically to increase the copper plate layer. Next, this is etched or processed with laser to form a wiring pattern that is to be the second circuit, and this gives the intended, multi-layered printed wiring board. The above-mentioned process may be repeated in which the second circuit is considered as the first circuit in order, and it gives a more multi-layered printed wiring board.

In the above, the varnish of the invention is cured during heat and press treatment, which, if desired, may be combined with, for example, room temperature curing to be effected by the action of catalyst, oxygen or moisture at around room temperature, and/or photo-curing to be effected by the catalytic action of an acid that is formed through UV irradiation, etc.

Next described is a material for flexible printed wiring boards, for which is used the varnish of the invention.

A substrate for flexible printed wiring boards has a three-layered structure of electric insulating film/adhesive/metal foil. In this, the thickness of the adhesive generally falls between 10 and 20 $\mu$m, but it may be suitably determined depending on the condition of use, etc. Regarding the conformation of a cover lay material, its main stream is a film base cover lay in which one face of the base film is coated with an adhesive. The film base cover lay has a three-layered structure of electric insulating film/adhesive/release film. In this, the thickness of the adhesive generally falls between 15 and 50 $\mu$m, but it may be suitably determined depending on the condition of use, etc. Other conformation of the cover lay than the above are a dry film-type cover lay, a liquid-type cover lay, etc. The dry film-type cover lay has a three-layered structure of release film/adhesive/release film, in which the adhesive serves also as an insulating layer. In this, the thickness of the adhesive generally falls between 25 and 100 $\mu$m, but it may be suitably determined depending on the condition of use, etc. In the liquid-type cover lay, the insulating layer is formed through coating and curing. A bonding sheet has a three-layered structure of release film/adhesive/release film. In this, the thickness of the adhesive generally falls between 15 and 50 $\mu$m, but it may be suitably determined depending on the condition of use, etc.

Specific examples of the electric insulating film usable in the above are polyimide films, PET (polyethylene terephthalate) films, polyester films, polyparabanic acid films, polyether-ether ketone films, polyphenylene sulfide films, aramide films, etc. Above all, polyimide films are preferred as having good heat resistance, dimensional stability, mechanical properties, etc. In general, the film thickness may fall between 12.5 and 75 $\mu$m, but is not specifically defined. It may be suitably determined in any desired manner. If desired, one or both faces of the film may be processed through cold plasma treatment, corona discharge treatment, sand blast treatment, etc.

The metal foil in the board for flexible printed wiring may be the same as that usable in the above-mentioned insulator-covered metal foil for build-up boards; and the release film may be the same as that usable in the above-mentioned insulating sheet for build-up boards.

For fabricating the film base cover lay, the varnish of the invention that has been previously prepared is applied onto an electric insulating film such as that mentioned above, by the use of a roll coater, a comma coater or the like. Then, this is led into an in-line drier, in which it is heated at 40 to 160° C. for 2 to 20 minutes to remove the solvent from the varnish, and an adhesive layer is thereby formed. Next, the adhesive-coated electric insulating film is stuck to a release film with its adhesive-coated face inside, by press with a hot roll. The coating thickness of the adhesive layer may fall generally between 15 and 50 $\mu$m in a dry state.

For fabricating the dry film-type cover lay, the previously-prepared varnish is applied onto a release film by the use of a roll coater, a comma coater or the like. Then, this is led into an in-line drier, in which it is heated at 40 to 160° C. for 2 to 20 minutes to remove the solvent from the varnish, and an adhesive layer is thereby formed. Next, the adhesive-coated release film is stuck to another release film with its adhesive-coated face inside, by press with a hot roll. The coating thickness of the adhesive layer may fall generally between 25 and 100 $\mu$m in a dry state.

The liquid-type cover lay may be prepared by adjusting the viscosity of the varnish mainly with the amount of the solvent so that it is suitable to coating methods.

For fabricating the bonding sheet, the previously-prepared varnish is coated onto a release film by the use of a roll coater, a comma coater or the like. Then, this is led into an in-line drier, in which it is heated at 40 to 160° C. for 2 to 20 minutes to remove the solvent from the varnish, and an adhesive layer is thereby formed. Next, the adhesive-coated release film is stuck to another release film with its adhesive-coated face inside, by press with a hot roll. The coating thickness of the adhesive layer may fall generally between 15 and 50 $\mu$m in a dry state.

For fabricating the board for flexible printed wiring of the invention, the previously-prepared varnish is coated onto the above-mentioned electric insulating film by the use of a roll coater, a comma coater or the like. Then, this is led into an in-line drier, in which it is heated at 40 to 160° C. for 2 to 20 minutes to remove the solvent from the varnish, and an adhesive layer is thereby formed. Next, the adhesive-coated electric insulating film is stuck to metal foil with its adhesive-coated face inside, by press with a hot roll. The coating thickness of the adhesive layer may fall generally between 10 and 20 µm in a dry state.

EXAMPLES

The invention is described more concretely with reference to the following Examples, to which, however, the invention is not limited.

Synthesis Example 1

Synthesis of phenolic hydroxyl group-having aromatic polyamide resin (hereinafter RPAM):

13.29 g (80 mmols) of isophthalic acid, 31.05 g (10 mmols) of bis(4-amino-3,5-diethylphenyl)methane, 3.64 g (20 mmols) of 5-hydroxyisophthalic acid, 2.50 g of lithium chloride, 7.50 g of calcium chloride, 200 ml of N,N-dimethylacetamide and 30 ml of pyridine were put into a one-liter, four-neck round-bottom flask, and stirred and dissolved, and then 62.05 g (20 mmols) of triphenyl phosphite was added thereto and reacted in a dry nitrogen atmosphere at 100° C. for 3 hours. This was left cooled to room temperature, and diluted with 400 ml of N,N-dimethylacetamide, and then poured into 8 liters of a methanol bath for precipitation with stirring to obtain a crude polymer. This crude polymer was purified in an ordinary manner. Its yield was 43.9 g (99%).

Synthesis Example 2

Synthesis of phenolic hydroxyl group-having aromatic polyamide-poly(butadiene-acrylonitrile) block copolymer (hereinafter BPAM: its phenolic hydroxyl group content in the aromatic polyamide moiety is 14 mol %: one example of the copolymer of formula (2)):

19.93 g (120 mmols) of isophthalic acid, 30.63 g (153 mmols) of 3,4'-diaminodiphenyl ether, 3.64 g (20 mmols) of 5-hydroxyisophthalic acid, 3.9 g of lithium chloride, 12.1 g of calcium chloride, 240 ml of N-methyl-2-pyrrolidone and 54 ml of pyridine were put into a one-liter, four-neck round-bottom flask, and stirred and dissolved, and then 74 g of triphenyl phosphite was added thereto and reacted at 90° C. for 4 hours to produce a phenolic hydroxyl group-having aromatic polyamide oligomer. A solution prepared by dissolving 48 g of a poly)butadiene-acrylonitrile) copolymer having a carboxyl group at both terminals thereof (Hycar CTBN by BF Goodrich: its acrylonitrile content in the poly(butadiene-acrylonitrile) moiety is 17 mol % and its molecular weight is about 3600) in 240 ml of N-methyl-2-pyrrolidone was added to the oligomer and reacted for 4 hours, and then cooled to room temperature. The resulting reaction mixture was poured into 20 liters of methanol, in which an aromatic polyamide-poly(butadiene-acrylonitrile) block copolymer for use in the invention was deposited. Its poly(butadiene-acrylonitrile) copolymer content is 50 wt % and its phenolic hydroxyl group content is about 14 mol %. Thus deposited, the polymer was washed with methanol and purified through reflux with methanol. Its intrinsic viscosity was 0.85 dl/g (dimethylacetamide, 30° C.). The IR spectrum of the polymer powder was measured through diffractive reflection, and the spectral pattern had an amidocarbonyl-derived absorption at 1674 cm$^{-1}$, a butadiene C—H bond-derived absorption at 2856 to 2975 cm$^{-1}$ and a nitrile-derived absorption at 2245 cm$^{-1}$.

Example 1

160 parts of cyclopentanone (by Nippon Zeon, having a boiling pint of 131° C.) was added to 100.0 parts of Epomic R-302 (bisphenol A-type epoxy resin by Mitsui Chemical, having an epoxy equivalent of 630 g/eq), 16.2 parts of PN-80 (phenol-novolak resin by Nippon Kayaku, having a hydroxyl equivalent of 100 g/eq) and, as a curing promoter, 0.3 parts of 2E4MZ (by Shikoku Kasei; 2-ethyl-4-methylimidazole), and stirred at room temperature and completely dissolved. 50.0 parts of RPAM obtained in Synthesis Example 1 was added to it, and stirred at room temperature and completely dissolved to obtain a polyamide resin-containing varnish of the invention.

Using an applicator, the thus-obtained polyamide resin-containing varnish was coated onto a PET film, and dried in a hot air-circulating drier at 140° C. for 4 minutes to form an adhesive film having a thickness of 30 µm.

The adhesive film was released from the PET film, and this was used as a sample for measuring the amount of the solvent remaining therein. The amount of the remaining solvent measured is shown in Table 1.

Example 2

160 parts of cyclopentanone (by Nippon Zeon, having a boiling pint of 131° C.) was added to 100.0 parts of Epomic R-302 (bisphenol A-type epoxy resin by Mitsui Chemical, having an epoxy equivalent of 630 g/eq), 16.2 parts of PN-80 (phenol-novolak resin by Nippon Kayaku, having a hydroxyl equivalent of 100 g/eq) and, as a curing promoter, 0.3 parts of 2E4MZ (by Shikoku Kasei; 2-ethyl-4-methylimidazole), and stirred at room temperature and completely dissolved. 50.0 parts of BPAM obtained in Synthesis Example 2 was added to it, and stirred at room temperature and completely dissolved to obtain a polyamide resin-containing varnish of the invention.

Using an applicator, the thus-obtained polyamide resin-containing varnish was coated onto a PET film, and dried in a hot air-circulating drier at 140° C. for 4 minutes to form an adhesive film having a thickness of 30 µm. The adhesive film was released from the PET film, and this was used as a sample for measuring the amount of the solvent remaining therein. The amount of the remaining solvent measured is shown in Table 1.

Example 3

160 parts of cyclohexanone (by Junsei Chemical, having a boiling pint of 156° C.) was added to 100.0 parts of Epomic R-302 (bisphenol A-type epoxy resin by Mitsui Chemical, having an epoxy equivalent of 630 g/eq), 16.2 parts of PN-80 (phenol-novolak resin by Nippon Kayaku, having a hydroxyl equivalent of 100 g/eq) and, as a curing promoter, 0.3 parts of 2E4MZ (by Shikoku Kasei; 2-ethyl-4-methylimidazole), and stirred at room temperature and completely dissolved. 50.0 parts of BPAM obtained in Synthesis Example 2 was added to it, and stirred at room temperature and completely dissolved to obtain a polyamide resin-containing varnish of the invention.

Using an applicator, the thus-obtained polyamide resin-containing varnish was coated onto a PET film, and dried in a hot air-circulating drier at 140° C. for 4 minutes to form an adhesive film having a thickness of 30 µm. The adhesive film was released from the PET film, and this was used as a sample for measuring the amount of the solvent remaining therein. The amount of the remaining solvent measured is shown in Table 1.

Example 4

100 parts of cyclopentanone (by Nippon Zeon, having a boiling pint of 131° C.) was added to 100 parts of Kayarad R-115 (bisphenol A-type epoxyacrylate by Nippon Kayaku), and, as a photopolymerization initiator, 5 parts of Irgacure-907 (2-methyl(4-(methylthio)phenyl)-2-morpholino-1-propane, by Ciba-Geigy), and stirred at room temperature and completely dissolved. 30.0 parts of BPAM obtained in Synthesis Example 2 was added to it, and stirred at room temperature and completely dissolved to obtain a polyamide resin-containing varnish of the invention.

Using an applicator, the thus-obtained polyamide resin-containing varnish was coated onto a PET film, and dried in a hot air-circulating drier at 80° C. for 20 minutes to form an adhesive film having a thickness of 20 μm. The adhesive film was released from the PET film, and this was used as a sample for measuring the amount of the solvent remaining therein. The amount of the remaining solvent measured is shown in Table 1.

The amount of the remaining solvent in the samples of the Examples was measured according to the method mentioned below.

(1) A hot air-circulating drier is previously heated at 200° C.
(2) The mass of an aluminium foil dish is measured, and this is W0.
(3) About 0.2 g of the sample is put on the aluminium foil dish, and this is measured. This is W1.
(4) The aluminium foil dish is put into the drier at 200° C. and dried therein for 10 minutes.
(5) After thus dried, the mass of the aluminium foil dish is measured, and this is W2.
(6) The amount of the solvent having remained in the sample is computed according to the following formula:

Amount of Remaining Solvent (%)=(W1−W2)/(W1−W0)×100

The adhesiveness of the adhesive films obtained in the above was measured according to the method mentioned below, and the result is given in Table 1.

(1) An adhesive film is transferred onto a glass substrate, using a laminator, and the PET film is peeled off. This is cured under a predetermined curing condition to prepare a sample.
(2) According to JIS K5400, 100 cross-cuts of 1 mm² each are formed in the adhesive film of the sample, and the sample is subjected to a peeling test with an adhesive Cellophane tape. The cross-cuts are observed as to whether or not they have peeled, and the samples tested are evaluated according to the following criterion.
O: No cross-cut peeled.

Curing condition
The adhesive films of Examples 1 to 3 were thermally cured at 150° C. for 1 hour.
The adhesive film of Example 4 was cured through exposure to UV rays, to which the total quantity of UV rays applied was 200 mJ/cm².

TABLE 1

|  | Examples | | | |
| --- | --- | --- | --- | --- |
|  | 1 | 2 | 3 | 4 |
| Amount of Remaining Solvent (%) | 0.2 | 0.2 | 0.4 | 0.4 |
| Adhesiveness | ○ | ○ | ○ | ○ |

INDUSTRIAL APPLICABILITY

Solvent removal from the varnish of the invention is easy in film formation, and the varnish gives films and adhesive layers with little solvent remaining therein. The varnish is extremely useful for laminate plates, metal foil-lined laminate plates, insulating materials for build-up boards, flexible printed wiring boards, materials for flexible printed wiring boards, etc.

What is claimed is:

1. A polyamide resin-containing varnish comprising a phenolic hydroxyl group-having aromatic polyamide resin (A) and, as a solvent, cyclopentanone (B).

2. The polyamide resin-containing varnish according to claim 1, wherein the phenolic hydroxyl group-having aromatic polyamide resin (A) is a polyamide resin that has, in the molecule, at least a structure of the following formula (1):

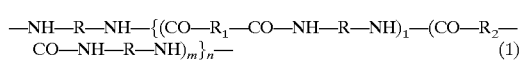

—NH—R—NH—{(CO—R₁—CO—NH—R—NH)ₗ—(CO—R₂—CO—NH—R—NH)ₘ}ₙ—    (1)

wherein R represents a divalent residue of an optionally-substituted aliphatic hydrocarbon having from 1 to 10 carbon atoms, or a divalent residue of multiple such residues bonded to each other via at least one crosslinking group selected from —CH₂—, —O—, —S—, —SO₂— and —NH—, or a divalent residue of an optionally-substituted aromatic hydrocarbon having from 6 to 10 carbon atoms, or a divalent aromatic hydrocarbon residue of multiple such aromatic hydrocarbon residues bonded to each other via at least one crosslinking group selected from an optionally-substituted linear or branched alkylene group having from 1 to 4 carbon atoms, —O—, —S—, —SO₂— and —NH—; R₁ represents a divalent hydrocarbon residue having at least one phenolic hydroxyl group and having from 6 to 12 carbon atoms; R₂ represents a hydrocarbon residue not having a phenolic hydroxyl group; l, m and n each represents an average degree of polymerization, and (l+m) is an integer of from 2 to 200, l/(m+l)≧0.04, and n is from 2 to 100.

3. The polyamide resin-containing varnish according to claim 2, wherein R is a divalent aromatic residue of two lower alkyl-substituted phenyls bonded to each other via a methylene group, or a divalent aromatic residue of two optionally-substituted phenyl groups bonded to each other via an oxygen atom; R₁ is a phenylene group having at least one phenolic hydroxyl group; and R₂ is a phenylene group not having a phenolic hydroxyl group.

4. A polyamide resin-containing varnish comprising a block copolymer formed from a phenolic hydroxyl group-having aromatic polyamide resin terminated with an aminoaryl group at both ends and a poly(butadiene-acrylonitrile) copolymer having a carboxyl group at both terminals, and a cycloalkanone having from 4 to 8 carbon atoms.

5. A polyamide resin-containing varnish comprising a block copolymer of the following formula (2):

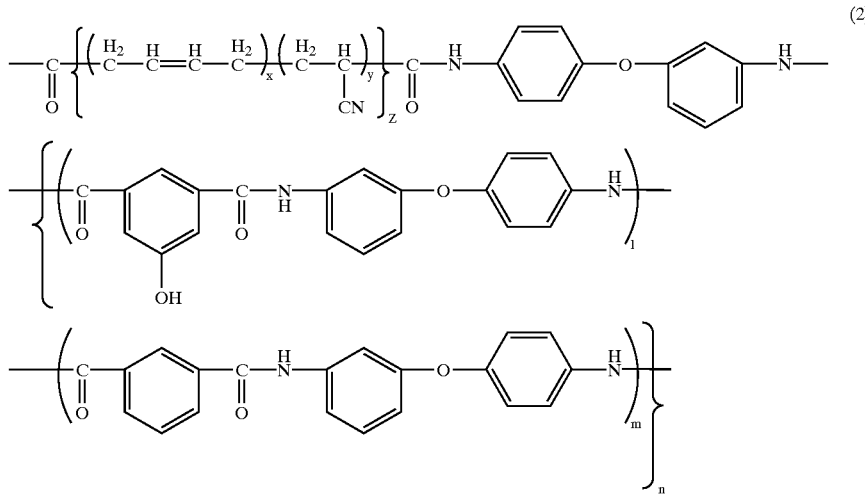

wherein x, y, z, l, m and n each represents an average degree of polymerization, and x is from 3 to 10, y is from 1 to 4, z is from 5 to 15, (l+m) is an integer of from 2 to 200, l/(m+l)≧0.04, and n is from 2 to 100, and a cycloalkanone having from 4 to 8 carbon atoms.

6. A substrate having an adhesive layer that is obtained by removing the solvent from the polyamide resin-containing varnish of any one claims 1, 4 or 5.

7. A material for flexible printed wiring boards, for which is used the polyamide resin-containing varnish of any one of claims 1, 4 or 5.

8. The polyamide resin-containing varnish according to any one of claims 1, 4 or 5, which contains a curable resin (C).

9. The polyamide resin-containing varnish according to claim 8, wherein the curable resin (C) is a thermosetting resin or a radiation-curable resin.

10. The polyamide resin-containing varnish according to claim 8, wherein the curable resin (C) is an epoxy resin.

11. A substrate having an adhesive layer that is obtained by removing the solvent from the polyamide resin-containing varnish of claim 8.

12. A material for flexible printed wiring boards, which comprises the adhesive layer obtained by removing the solvent from the polyamide resin-containing varnish of claim 8.

13. A cured article obtained by removing solvent from the polyamide resin varnish of claim 8, followed by curing it.

14. A printed wiring board which has a cured layer of the adhesive layer that is formed by the use of the polyamide resin varnish of claim 8.

* * * * *